US012610864B2

(12) United States Patent
Sakai et al.

(10) Patent No.: US 12,610,864 B2
(45) Date of Patent: Apr. 21, 2026

(54) SEMICONDUCTOR DEVICE

(71) Applicant: Mitsubishi Electric Corporation, Tokyo (JP)

(72) Inventors: Junya Sakai, Tokyo (JP); Kenji Hatori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 641 days.

(21) Appl. No.: 18/047,581

(22) Filed: Oct. 18, 2022

(65) Prior Publication Data

US 2023/0178535 A1     Jun. 8, 2023

(30) Foreign Application Priority Data

Dec. 6, 2021     (JP) ................................. 2021-197748

(51) Int. Cl.
| | |
|---|---|
| *H01L 25/18* | (2023.01) |
| *H01L 23/00* | (2006.01) |
| *H10D 8/00* | (2025.01) |
| *H10D 30/66* | (2025.01) |

(52) U.S. Cl.
CPC .............. *H01L 25/18* (2013.01); *H01L 24/48* (2013.01); *H10D 8/00* (2025.01); *H10D 30/66* (2025.01); *H01L 2224/48225* (2013.01)

(58) Field of Classification Search
None
See application file for complete search history.

(56) References Cited

U.S. PATENT DOCUMENTS

| | | |
|---|---|---|
| 2017/0263712 A1 | 9/2017 | Siemieniec et al. |
| 2018/0026009 A1 | 1/2018 | Fujita et al. |
| 2018/0315813 A1 | 11/2018 | Shiomi et al. |
| 2022/0123112 A1 | 4/2022 | Tawara et al. |

FOREIGN PATENT DOCUMENTS

| | | | | |
|---|---|---|---|---|
| CN | 109671682 B | * | 3/2025 | ........... H01L 23/562 |
| JP | 2006-319079 A | | 11/2006 | |
| JP | 2006-319236 A | | 11/2006 | |
| JP | 2017-168834 A | | 9/2017 | |
| JP | 2018-174357 A | | 11/2018 | |
| JP | 2021-015880 A | | 2/2021 | |
| WO | 2016/147243 A1 | | 9/2016 | |
| WO | 2017/043608 A1 | | 3/2017 | |

OTHER PUBLICATIONS

An Office Action; "Decision of Refusal," mailed by the Japanese Patent Office on Jan. 14, 2025, which corresponds to Japanese Patent Application No. 2021-197748 and is related to U.S. Appl. No. 18/047,581; with English language translation.
"Notice of Reasons for Refusal" Office Action issued in JP 2021-197748; mailed by the Japanese Patent Office on Oct. 8, 2024.

* cited by examiner

*Primary Examiner* — Jack S Chen
(74) *Attorney, Agent, or Firm* — Studebaker Brackett PLLC

(57) ABSTRACT

A semiconductor device includes: a plurality of semiconductor chips spaced apart from one another; and a conductive part. The plurality of semiconductor chips include respective semiconductor switching elements. The conductive part connects the plurality of semiconductor chips in parallel. A material of the semiconductor switching elements of the plurality of semiconductor chips includes a wide bandgap semiconductor. At least one of the semiconductor switching elements has a channel length of 1.5 μm or less.

6 Claims, 4 Drawing Sheets

F I G. 1
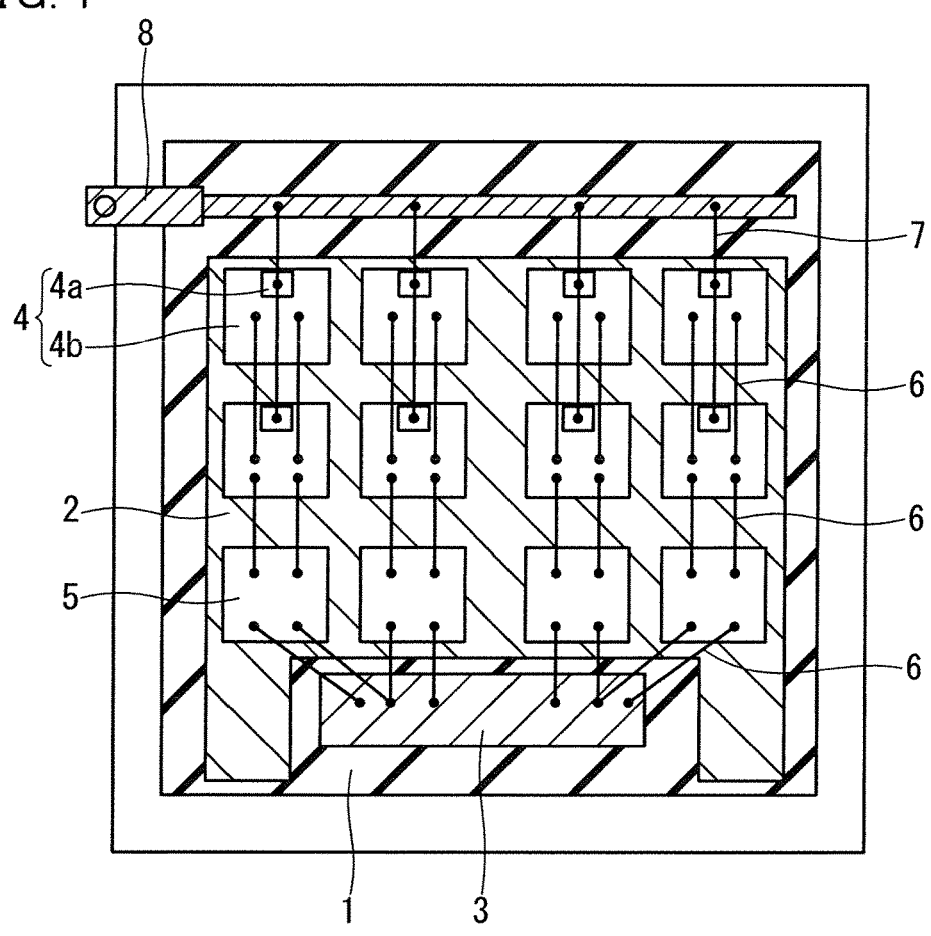
F I G. 2
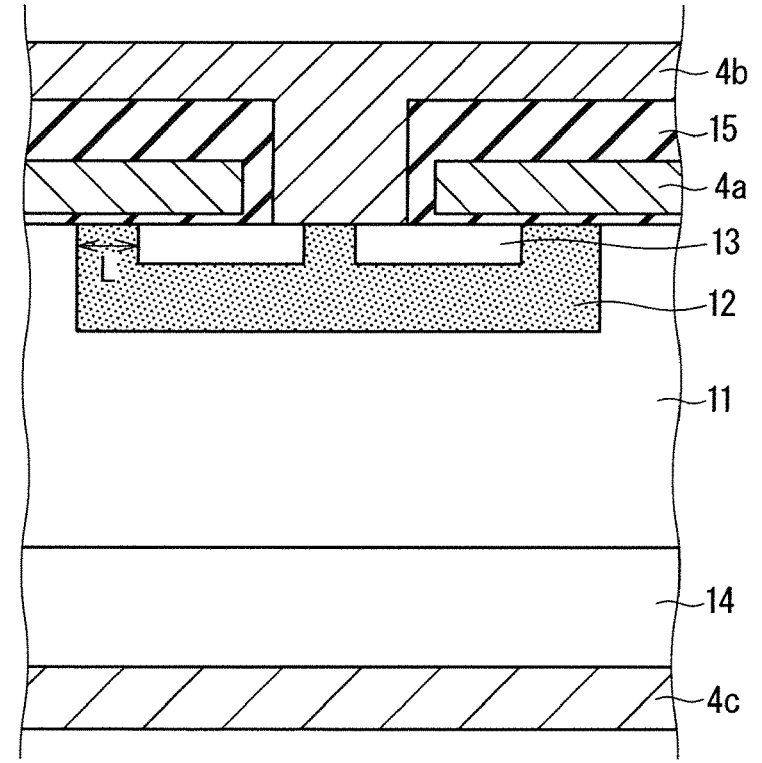

F I G . 3
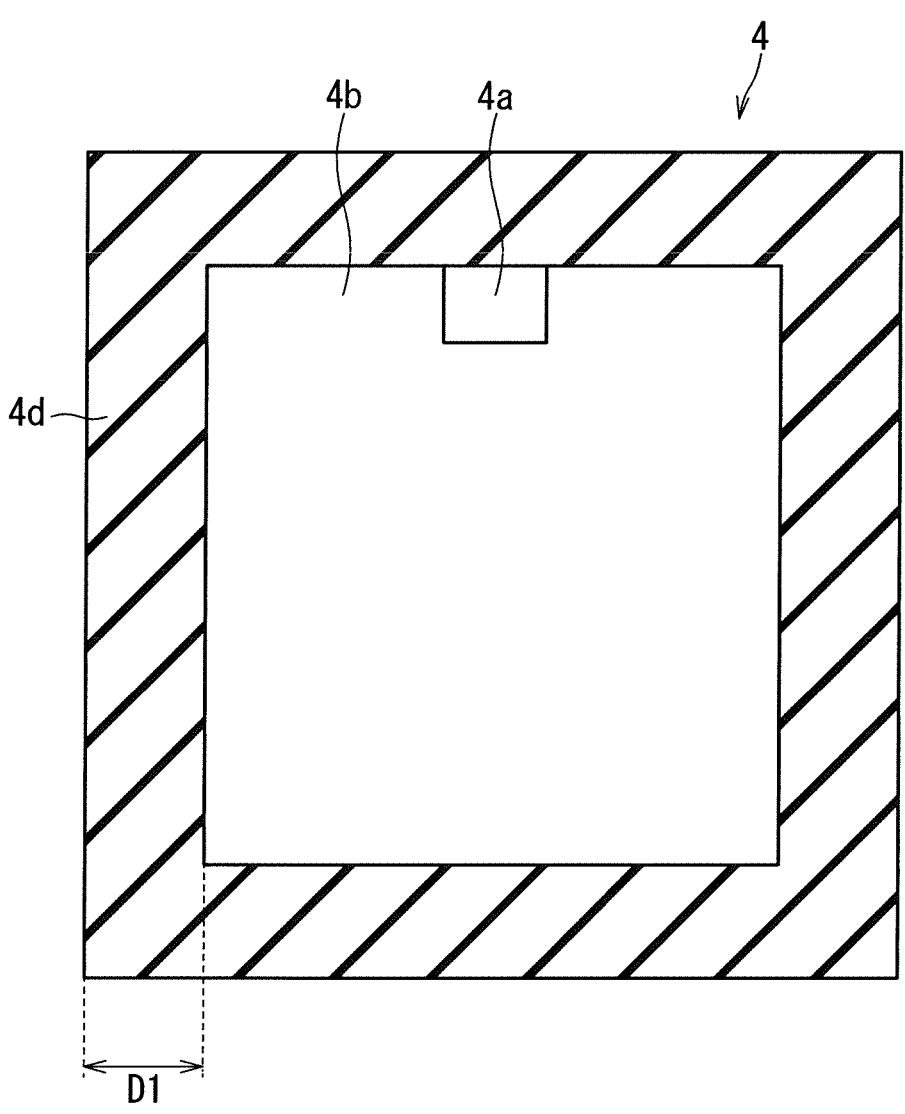

SEMICONDUCTOR DEVICE

BACKGROUND OF THE INVENTION

Field of the Invention

The present disclosure relates to semiconductor devices.

Description of the Background Art

A semiconductor switching element including a wide bandgap semiconductor, such as silicon carbide (SiC), as a material thereof has recently been proposed (e.g., International Publication No. 2016/147243).

In a semiconductor device in which a plurality of semiconductor switching elements including a wide bandgap semiconductor as a material thereof are connected in parallel, the phenomenon of signal oscillation is likely to occur not only during steady state operation but also during startup and short circuit operation. The phenomenon of oscillation becomes noticeable particularly in a configuration in which semiconductor chips are connected in parallel.

SUMMARY

The present disclosure has been conceived in view of a problem as described above, and it is an object of the present disclosure to provide technology enabling suppression of the phenomenon of oscillation.

A semiconductor device according to the present disclosure includes: a plurality of semiconductor chips including respective semiconductor switching elements and spaced apart from one another; and a conductive part connecting the plurality of semiconductor chips in parallel. A material of the semiconductor switching elements includes a wide bandgap semiconductor, and at least one of the semiconductor switching elements has a channel length of 1.5 μm or less.

The phenomenon of oscillation can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a configuration of a semiconductor device according to Embodiment 1;

FIG. 2 is a cross-sectional view showing a configuration of a semiconductor switching element according to Embodiment 1;

FIG. 3 is a plan view showing a configuration of a semiconductor switching element according to Embodiment 2;

DESCRIPTION OF THE PREFERRED EMBODIMENTS

Figure 4:
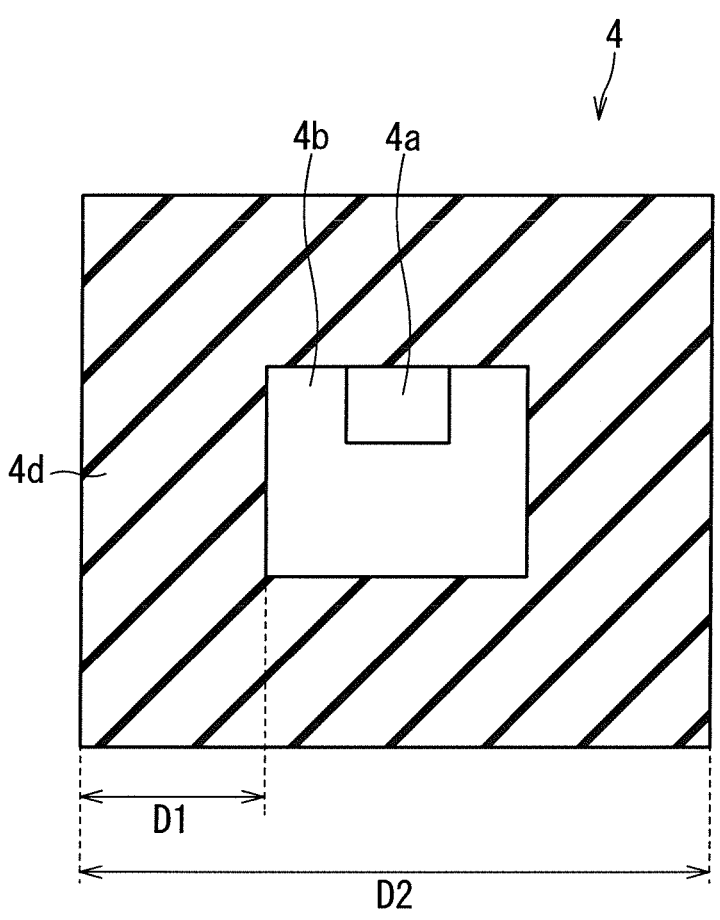
FIG. 4 is a plan view showing a configuration of a semiconductor switching element according to a modification of Embodiment 2.

Embodiments will be described below with reference to the accompanying drawings. Features described in the embodiments below are examples, and all the features are not necessarily required. In description made below, similar components in the embodiments bear the same or similar reference signs, and different components will mainly be described. In description made below, specific locations and directions represented by terms such as "upper", "lower", "left", "right", "front", and "back" may not necessarily match locations and directions in actual implementation. A higher concentration in a portion than in another portion means that an average concentration in the portion is higher than an average concentration in the other portion, for example. In contrast, a lower concentration in a portion than in another portion means that an average concentration in the portion is lower than an average concentration in the other portion, for example.

Embodiment 1

FIG. 1 is a plan view showing a configuration of a semiconductor device according to Embodiment 1. The semiconductor device in FIG. 1 includes an insulating substrate 1, circuit patterns 2 and 3, a plurality of semiconductor chips 4 and 5, wires 6 and 7, and a gate terminal 8.

The circuit patterns 2 and 3 are spaced apart from each other, and are selectively arranged on the insulating substrate 1. A material of the circuit patterns 2 and 3 is metal, such as copper.

The plurality of semiconductor chips 4 are spaced apart from one another, and are selectively arranged on the circuit pattern 2. The semiconductor chips 4 include respective semiconductor switching elements, such as metal oxide semiconductor field effect transistors (MOSFETs), insulated gate bipolar transistors (IGBTs), and reverse conducting-IGBTs (RC-IGBTs), and the semiconductor switching elements each include a gate electrode 4a and a source electrode 4b insulated from each other. The semiconductor switching elements may be planar semiconductor switching elements or may be trench semiconductor switching elements. The number of semiconductor chips 4 is not limited to eight as shown in an example of FIG. 1, and is only required to be two or more.

A material of the semiconductor switching elements of the semiconductor chips 4 includes a wide bandgap semiconductor. Examples of the wide bandgap semiconductor include silicon carbide (SiC), gallium nitride (GaN), and diamond. The semiconductor switching elements made of the wide bandgap semiconductor are capable of stable operation at a high temperature and a high voltage and faster switching speed compared with the semiconductor switching elements made of silicon.

The semiconductor chips 5 are spaced apart from the plurality of semiconductor chips 4, and are selectively arranged on the circuit pattern 2. The semiconductor chips 5 each include a diode, such as a PN junction diode (PND) and a Schottky barrier diode (SBD). A material of the diode of each of the semiconductor chips 5 may include the wide bandgap semiconductor as with the material of the semiconductor switching elements of the semiconductor chips 4.

The circuit pattern 2 and drain electrodes of the semiconductor chips 4 are connected, and the circuit pattern 2 has a function of a drain terminal. The wires 6 connect source electrodes 4b of the semiconductor chips 4, connect the semiconductor chips 4 and the semiconductor chips 5, and connect the semiconductor chips 5 and the circuit pattern 3. Due to this connection, the circuit pattern 3 has a function of a source terminal. The wires 7 connect gate electrodes 4a of the semiconductor chips 4 and the gate terminal 8. A material of the wires 6 and 7 is aluminum, for example. Instead of using the wires 6 and 7 for the semiconductor chips 4 and 5, direct lead bonding may be used to connect leads to the semiconductor chips 4 and 5.

A conductive part according to Embodiment 1 includes the circuit patterns 2 and 3 and the wires 6 as described above, and connects the plurality of semiconductor chips 4 in parallel. In the example of FIG. 1, four columns of semiconductor chips 4 are connected in parallel by the circuit patterns 2 and 3 and the wires 6.

FIG. 2 is a cross-sectional view showing a configuration of each of the semiconductor switching elements of the semiconductor chips 4. An example in which the semiconductor switching element is a MOSFET will be described below.

The semiconductor switching element in FIG. 2 includes the gate electrode 4a, the source electrode 4b, a drain electrode 4c, an n⁻ layer 11, a p layer 12, n⁺ layers 13 and 14, and an insulating layer 15. The n⁺ layers 13 and 14 have a higher n-type impurity concentration than the n⁻ layer 11. The n-type and the p-type of these components in FIG. 2 may be reversed.

The p layer 12 is selectively disposed in an upper portion of the n⁻ layer 11, and the n⁺ layer 13 is selectively disposed in an upper portion of the p layer 12. The gate electrode 4a is disposed over a portion of the p layer 12 located between the n⁻ layer 11 and the n⁺ layer 13 via the insulating layer 15. The insulating layer 15 has an opening exposing a portion of the p layer 12 and a portion of the n⁺ layer 13, and the source electrode 4b is electrically connected to the p layer 12 and the n⁺ layer 13 via the opening. The n⁺ layer 14 is disposed in a lower portion of the n⁻ layer 11, and the drain electrode 4c is disposed in a lower portion of the n⁺ layer 14.

When a gate voltage greater than a threshold voltage is applied to the gate electrode 4a, the type of the p layer 12 close to the gate electrode 4a is reversed to the n-type to form a channel to allow a current to flow between the n⁻ layer 11 and the n⁺ layer 13. A channel length L is the length of the channel, and corresponds to the distance between the n⁻ layer 11 and the n⁺ layer 13 sandwiching the p layer 12. In Embodiment 1, at least one of the semiconductor switching elements has a channel length L of 1.5 μm or less. The channel length L can be measured by a scanning transmission electron microscope (STEM), secondary ion mass spectrometry (SIMS), and the like.

<Summary of Embodiment 1>

The semiconductor switching element, such as a MOSFET, is typically likely to be in a pinched off state, that is, a state in which the channel is closed to make a current less likely to flow, when a current increases during short circuit and the like. In Embodiment 1, the plurality of semiconductor chips 4 spaced apart from one another are connected in parallel by the circuit patterns 2 and 3 and the wires 6, and at least one of the semiconductor switching elements of the plurality of semiconductor chips 4 has a channel length L of 1.5 μm or less. The channel length L is relatively short, so that drain resistance can be reduced to mitigate the pinched off state. Since the channel length L is relatively short, parasitic capacitance of a gate can be reduced.

As a result, the phenomenon of oscillation of the semiconductor switching elements of the semiconductor chips 4 can be suppressed, and thus improvement in reliability of the semiconductor device can be expected. The inventors have found that, in a configuration in which the material of the semiconductor switching elements includes the wide bandgap semiconductor, the effect of suppressing the phenomenon of oscillation when the channel length L is 1.5 μm is more noticeable than the effect of suppressing the phenomenon of oscillation when the channel length L is 1.6 μm. When the number of columns of semiconductor chips 4 connected in parallel exceeds three, it is practically difficult to suppress the phenomenon of oscillation by matching circuit lengths, such as the lengths of the wires 6, so that the above-mentioned effect is particularly useful.

<Modification>

The wires 6 may connect the circuit pattern 2 and any of the plurality of semiconductor chips 4, and the wires 6 may each have a length of 5 mm or more. Since the channel length L is relatively short, the phenomenon of oscillation of the semiconductor switching elements of the semiconductor chips 4 can be suppressed even when the wires 6 each have a length of 5 mm or more. The wires 6 each having a length of 5 mm or more allow tolerance to design relating to electrical insulation. The present modification may be applied to configurations in and after Embodiment 2.

Embodiment 2

FIG. 3 is a plan view showing a configuration of a portion of a semiconductor device according to Embodiment 2, and specifically shows a configuration of a semiconductor switching element of a semiconductor chip 4 according to Embodiment 2.

The semiconductor switching element in FIG. 3 includes a termination structure 4d in addition to the gate electrode 4a and the source electrode 4b described above. The area of the gate electrode 4a and the source electrode 4b is also referred to as an effective current carrying area. The termination structure 4d is a guard ring, for example, and surrounds the gate electrode 4a and the source electrode 4b.

In Embodiment 2, at least one of the semiconductor switching elements includes the termination structure 4d having a width D1 of 1 mm or more, and at least one of the semiconductor switching elements has a breakdown voltage of 2.0 kV or more. A configuration other than the above-mentioned configuration is similar to that in Embodiment 1.

An increase in width D1 of the termination structure 4d of the semiconductor switching element typically increases the breakdown voltage of the semiconductor switching element, but increases the size of the semiconductor chip 4. The increase in size of the semiconductor chip 4 naturally increases the lengths of the wires 6 connecting the semiconductor chips 4 to make the phenomenon of oscillation of the semiconductor switching elements of the semiconductor chips 4 more likely to occur.

According to Embodiment 2, however, the channel length L is relatively short as in Embodiment 1, so that the phenomenon of oscillation of the semiconductor switching elements of the semiconductor chips 4 can be suppressed. As a result, a semiconductor device capable of high speed operation while suppressing the phenomenon of oscillation even when having a relatively high breakdown voltage can be achieved.

<Modification>

FIG. 4 is a plan view showing a configuration of a portion of a semiconductor device according to a modification of Embodiment 2, and specifically shows a configuration of a semiconductor switching element of a semiconductor chip 4 according to the modification.

As shown in FIG. 4, with respect to at least one of the plurality of semiconductor chips 4, the semiconductor chip 4 may have a side length D2 equal to or greater than three times the width D1 of the termination structure 4d of a semiconductor switching element of the semiconductor chip 4. According to such a configuration, a semiconductor device capable of high speed operation while suppressing the phenomenon of oscillation can be achieved as in Embodiment 2.

Embodiment 3

Figure 5:
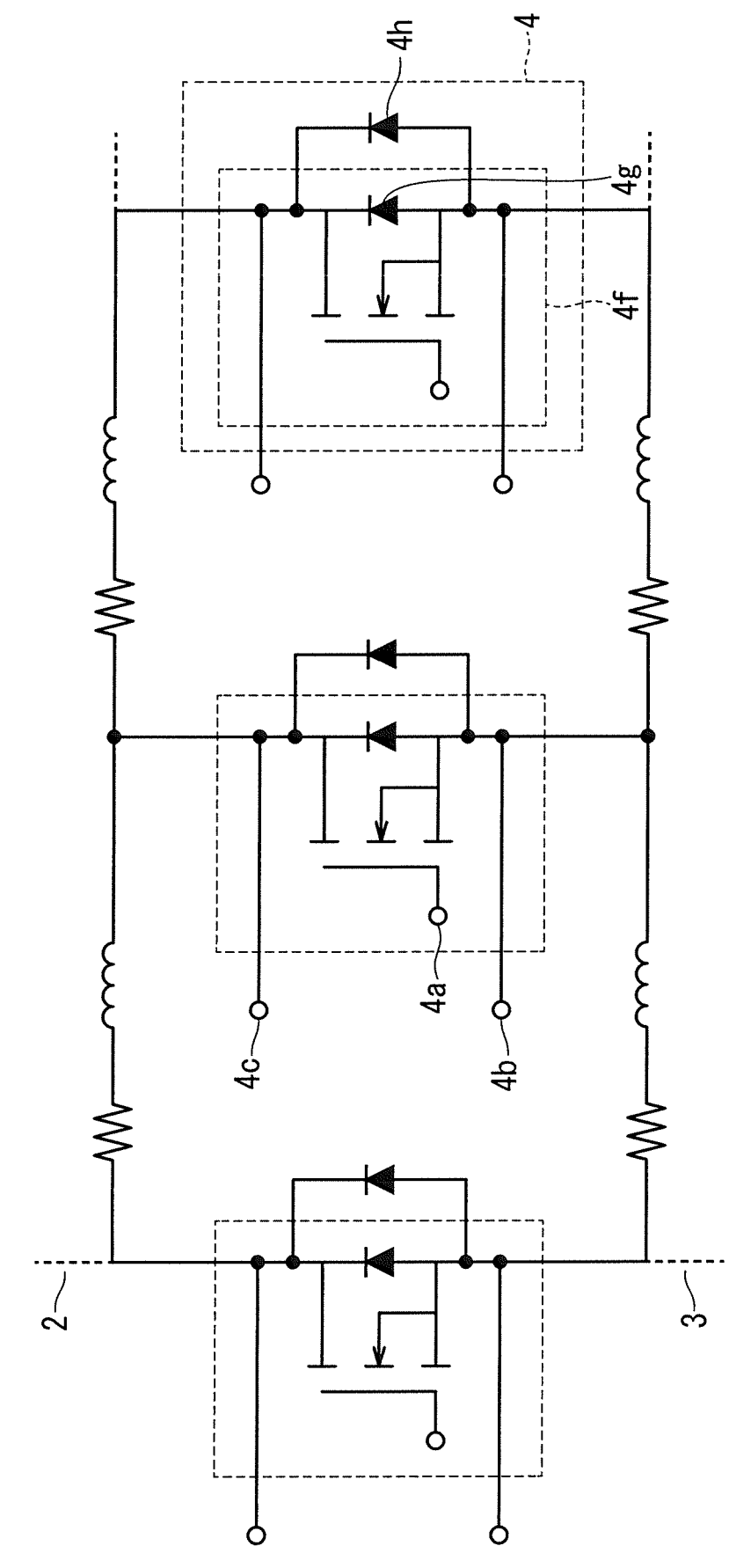
FIG. 5 is a circuit diagram showing a configuration of a semiconductor device according to Embodiment 3.

FIG. 5 is a circuit diagram showing a configuration of a semiconductor device according to Embodiment 3. In FIG. 5, three semiconductor chips 4 are connected in parallel.

At least one of the semiconductor chips 4 in FIG. 5 includes a semiconductor switching element 4*f*, a body diode 4*g*, and a freewheeling diode 4*h*. The semiconductor switching element 4*f* is similar to each of the semiconductor switching elements described in Embodiment 1. The body diode 4*g* is a diode intrinsically formed by a pn junction of the semiconductor switching element 4*f*. The freewheeling diode 4*h* is connected to the semiconductor switching element 4*f*. The freewheeling diode 4*h* is not the body diode 4*g*, and is separately disposed in a semiconductor substrate that is the same as the semiconductor substrate in which the semiconductor switching element 4*f* is disposed, that is, a semiconductor chip 4 that is the same as the semiconductor chip 4 in which the semiconductor switching element 4*f* is disposed. A configuration other than the above-mentioned configuration is similar to that in Embodiment 1.

According to a configuration according to Embodiment 3 as described above, the freewheeling diode 4*h* built in the semiconductor chip 4 that is the same as the semiconductor chip 4 in which the semiconductor switching element 4*f* is disposed can perform freewheeling operation. This eliminates the need to mount another semiconductor chip, such as the semiconductor chips 5 in FIG. 1, allowing for reduction in size of the semiconductor device. Due to omission of another semiconductor chip, component count can be reduced to suppress oscillation between the semiconductor chips 4. The freewheeling diode 4*h* can reduce use of the body diode 4*g*, so that property deterioration of the body diode 4*g* can be suppressed to increase lifetime of the semiconductor device.

Embodiments and modifications can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a plurality of semiconductor chips including respective semiconductor switching elements and spaced apart from one another; and a conductive part connecting the plurality of semiconductor chips in parallel, wherein a material of the semiconductor switching elements comprises a wide bandgap semiconductor, at least one of the semiconductor switching elements has a channel length of 1.5 μm or less, and the channel length is a distance of a channel formed in semiconductor material of the at least one of the semiconductor switching elements when the at least one of the semiconductor switching elements is in an on state.

2. The semiconductor device according to claim 1, wherein at least one of the semiconductor switching elements includes a termination structure having a width of 1 mm or more.

3. The semiconductor device according to claim 1, wherein at least one of the semiconductor switching elements has a breakdown voltage of 2.0 kV or more.

4. The semiconductor device according to claim 1, wherein at least one of the plurality of semiconductor chips further includes a freewheeling diode that is not a body diode of each of the semiconductor switching elements.

5. The semiconductor device according to claim 1, wherein with respect to at least one of the plurality of semiconductor chips, the the semiconductor chip has a side length equal to or greater than three times a width of a termination structure of one of the semiconductor switching elements of the semiconductor chip.

6. The semiconductor device according to claim 1, wherein the conductive part includes:

a circuit pattern; and a wire connecting any of the plurality of semiconductor chips and the circuit pattern, and having a length of 5 mm or more.

* * * * *